(12) United States Patent
Baumgartner et al.

(10) Patent No.: US 8,566,764 B2
(45) Date of Patent: *Oct. 22, 2013

(54) ENHANCED ANALYSIS OF ARRAY-BASED NETLISTS VIA PHASE ABSTRACTION

(75) Inventors: Jason R. Baumgartner, Austin, TX (US); Michael L. Case, Pflugerville, TX (US); Hari Mony, Austin, TX (US); Paul J. Roessler, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 407 days.

This patent is subject to a terminal disclaimer.

(21) Appl. No.: 12/771,404

(22) Filed: Apr. 30, 2010

(65) Prior Publication Data

US 2011/0271243 A1 Nov. 3, 2011

(51) Int. Cl.
 *G06F 17/50* (2006.01)
(52) U.S. Cl.
 USPC ............................... 716/108; 716/106; 703/14
(58) Field of Classification Search
 USPC ...................... 716/106, 108; 703/14
 See application file for complete search history.

(56) References Cited

U.S. PATENT DOCUMENTS

| | | | |
|---|---|---|---|
| 5,255,239 A | 10/1993 | Taborn et al. | |
| 5,377,123 A | 12/1994 | Hyman | |
| 5,644,498 A | 7/1997 | Joly et al. | |
| 5,708,612 A | 1/1998 | Abe | |
| 5,748,527 A | 5/1998 | Lee et al. | |
| 5,818,726 A | 10/1998 | Lee | |
| 5,918,035 A * | 6/1999 | Van Praet et al. | 703/22 |
| 5,953,283 A | 9/1999 | Meltzer et al. | |
| 6,173,435 B1 * | 1/2001 | Dupenloup | 716/104 |
| 6,356,485 B1 | 3/2002 | Proebsting | |
| 6,374,205 B1 | 4/2002 | Kuribayashi et al. | |
| 6,374,390 B1 | 4/2002 | Quarles et al. | |
| 6,378,112 B1 | 4/2002 | Martin et al. | |

(Continued)

FOREIGN PATENT DOCUMENTS

| | | |
|---|---|---|
| EP | 1770495 A1 | 4/2007 |
| JP | 06162139 A2 | 6/1994 |
| JP | 09035497 A | 2/1997 |
| JP | 2008541331 | 11/2008 |

OTHER PUBLICATIONS

U.S. Appl. No. 12/771,479.
U.S. Appl. No. 12/771,613.

(Continued)

*Primary Examiner* — Naum Levin
(74) *Attorney, Agent, or Firm* — Stephen R. Tkacs; Stephen J. Walder, Jr.; Libby Z. Toub

(57) ABSTRACT

A mechanism is provided for increasing the scalability of transformation-based formal verification solutions through enabling the use of phase abstraction on logic models that include memory arrays. The mechanism manipulates the array to create a plurality of copies of its read and write ports, representing the different modulo time frames. The mechanism converts all write-before-read arrays to read-before-write and adds a bypass path around the array from write ports to read ports to capture any necessary concurrent read and write forwarding. The mechanism uses an additional set of bypass paths to ensure that the proper write data that becomes effectively concurrent through the unfolding inherent in phase abstraction is forwarded to the proper read port. If a given read port is disabled or fetches out-of-bounds data, the mechanism applies randomized data to the read port data output.

20 Claims, 11 Drawing Sheets

(56) References Cited

U.S. PATENT DOCUMENTS

| | | | |
|---|---|---|---|
| 6,425,116 B1 | 7/2002 | Duboc et al. | |
| 6,449,747 B2 | 9/2002 | Wuytack et al. | |
| 6,532,440 B1 | 3/2003 | Boppana et al. | |
| 6,571,204 B1 | 5/2003 | Meyer | |
| 6,611,952 B1 | 8/2003 | Prakash et al. | |
| 6,636,939 B1 | 10/2003 | George | |
| 6,654,849 B1 | 11/2003 | Brockman et al. | |
| 6,698,003 B2 | 2/2004 | Baumgartner et al. | |
| 6,717,884 B2 | 4/2004 | Kim | |
| 6,748,573 B2 | 6/2004 | Baumgartner et al. | |
| 6,763,505 B2 * | 7/2004 | Baumgartner et al. | 716/108 |
| 6,847,927 B2 | 1/2005 | Hoffman et al. | |
| 7,006,370 B1 | 2/2006 | Ramesh et al. | |
| 7,069,523 B2 | 6/2006 | Nation et al. | |
| 7,194,724 B2 | 3/2007 | Hattori et al. | |
| 7,260,799 B2 | 8/2007 | Baumgartner et al. | |
| 7,290,228 B2 * | 10/2007 | Guenther et al. | 716/106 |
| 7,299,432 B2 | 11/2007 | Baumgartner et al. | |
| 7,340,577 B1 | 3/2008 | Van Dyke et al. | |
| 7,367,002 B2 | 4/2008 | Baumgartner et al. | |
| 7,386,818 B2 | 6/2008 | Ganai et al. | |
| 7,398,484 B2 | 7/2008 | Ruf | |
| 7,448,005 B2 | 11/2008 | Baumgartner et al. | |
| 7,506,297 B2 | 3/2009 | Mukherjee et al. | |
| 7,512,925 B2 | 3/2009 | Birmiwal et al. | |
| 7,523,380 B1 | 4/2009 | Trimberger | |
| 7,778,812 B2 | 8/2010 | Hoffman, Jr. | |
| 7,934,180 B2 * | 4/2011 | Baumgartner et al. | 716/100 |
| 7,962,880 B2 | 6/2011 | Lipetz et al. | |
| 8,001,498 B2 | 8/2011 | Bjesse | |
| 8,146,034 B2 | 3/2012 | Baumgartner et al. | |
| 8,181,131 B2 * | 5/2012 | Baumgartner et al. | 716/103 |
| 2001/0052106 A1 | 12/2001 | Wuytack et al. | |
| 2003/0065965 A1 | 4/2003 | Korobkov | |
| 2003/0123319 A1 | 7/2003 | Kim | |
| 2004/0039893 A1 | 2/2004 | Lyon | |
| 2004/0117744 A1 | 6/2004 | Nation et al. | |
| 2005/0091475 A1 | 4/2005 | Sodani | |
| 2005/0193359 A1 * | 9/2005 | Gupta et al. | 716/18 |
| 2006/0136849 A1 | 6/2006 | Greenberg et al. | |
| 2006/0156269 A1 | 7/2006 | Hoffman, Jr. | |
| 2007/0067746 A1 | 3/2007 | Baumgartner et al. | |
| 2007/0121499 A1 | 5/2007 | Pal et al. | |
| 2008/0066034 A1 | 3/2008 | Baumgartner et al. | |
| 2008/0120085 A1 | 5/2008 | Alexanian et al. | |
| 2008/0134114 A1 | 6/2008 | Bjesse et al. | |
| 2008/0144421 A1 | 6/2008 | Deng et al. | |
| 2009/0013301 A1 | 1/2009 | Ogilvie et al. | |
| 2009/0119428 A1 | 5/2009 | Chow et al. | |
| 2009/0144674 A1 | 6/2009 | Koithyar et al. | |
| 2009/0190386 A1 | 7/2009 | Kim | |
| 2009/0228848 A1 | 9/2009 | Kumazaki | |
| 2010/0020605 A1 | 1/2010 | Aritome | |
| 2010/0097837 A1 | 4/2010 | Paul | |
| 2010/0107132 A1 * | 4/2010 | Bjesse | 716/5 |
| 2010/0293513 A1 | 11/2010 | Baumgartner et al. | |
| 2011/0066578 A1 | 3/2011 | Chong et al. | |
| 2011/0145780 A1 | 6/2011 | Chen | |
| 2011/0270597 A1 | 11/2011 | Baumgartner et al. | |
| 2011/0271242 A1 | 11/2011 | Baumgartner et al. | |
| 2011/0271244 A1 * | 11/2011 | Baumgartner et al. | 716/106 |
| 2011/0276930 A1 * | 11/2011 | Baumgartner et al. | 716/106 |
| 2011/0276931 A1 * | 11/2011 | Baumgartner et al. | 716/106 |
| 2011/0276932 A1 * | 11/2011 | Baumgartner et al. | 716/106 |
| 2011/0307663 A1 | 12/2011 | Kultursay et al. | |
| 2012/0179806 A1 | 7/2012 | Torii | |

OTHER PUBLICATIONS

U.S. Appl. No. 12/771,677.
U.S. Appl. No. 12/775,607.
U.S. Appl. No. 12/775,622.
U.S. Appl. No. 12/775,633.
Bardell, PH et al., "Random Pattern Testability of the Logic Surrounding Memory Arrays", IBM technical Disclosure Bulletin, IPCOM000039582D, Jul. 1987, pp. 521-528.
Baumgartner, J et al., "Maximal Input Reduction of Sequential Netlists via Synergistic Reparameterization and Localization Strategies", Correct Hardware Design and Verification Methods, 13th IFIP WG 10.5 Advanced Research Working Conference, CHARME 2005, Proceedings 3-6, Saarbrucken, Germany, Oct. 2005, 1 page.
Burch, Jerry R. et al., "Automatic Verification of Pipelined Microprocessor Control", Lecture Notes in Computer Science, vol. 818, Proceedings of the 6th International Conference on Computer Aided Verification, Year of Publication 1994, pp. 68-80.
Pandey, M et al., "Formal Verification of Memory Arrays Using Symbolic Trajectory Evaluation", IEEE International Workshop on Memory Technology, Design and Testing (MTDT 1997), pp. 42.
Ray, Sandip et al., "Abstracting and Verifying Flash Memories", http://userweb.cs.utexas.edu/~sandip/publicationsiflash-nvm-08/flash.pdf, <retrieved on Mar. 10, 2010>, 5 pages.
Velev, Miroslav et al., "Efficient Modeling of Memory Arrays in Symbolic Simulation", Computer Aided Verification, vol. 1254/1997, Jun. 1997, pp. 388-399.
Notice of Allowance mailed Jan. 12, 2012 for U.S. Appl. No. 12/771,613, 11 pp.
Notice of Allowance mailed Nov. 29, 2011 for U.S. Appl. No. 12/771,677, 11 pp.
Office Action mailed Oct. 24, 2011 for U.S. Appl. No. 12/775,633, 15 pp.
Office Action mailed Dec. 9, 2011 for U.S. Appl. No. 12/775,622, 11 pp.
Notice of Allowance mailed Feb. 28, 2012 for U.S. Appl. No. 12/775,633, 7 pages.
Notice of Allowance mailed Mar. 26, 2012 for U.S. Appl. No. 12/775,622, 12 pages.
Office Action mailed Mar. 8, 2012 for U.S. Appl. No. 12/775,607, 18 pages.
Response to Office Action filed with the USPTO on Jan. 24, 2012 for U.S. Appl. No. 12/775,633, 11 pages.
Response to Office Action filed with the USPTO on Mar. 9, 2012 for U.S. Appl. No. 12/775,622, 15 pages.
Notice of Allowance mailed Aug. 3, 2012 for U.S. Appl. No. 12/775,622; 10 pages.
Office Action mailed Nov. 5, 2012 for U.S. Appl. No. 12/771,479; 21 pages.
Response to Office Action filed wtih the USPTO on Feb. 5, 2013 for U.S. Appl. No. 12/771,479, 10 pages.
Notice of Allowance mailed Feb. 28, 2013 for U.S. Appl. No. 12/771,479; 8 pages.
Notice of Allowance rnailed Jun. 1, 2012 for U.S. Appl. No, 12/775,633; 6 pages.
Notice of Allowance mailed Jun. 25, 2012 for U.S. Appl. No. 12/775,607; 10 pages.
Response to Office Action filed with the USPTO on Jun. 8, 2012 for U.S. Appl. No. 12/775,607, 10 pages.
Ganai, Malay K. et al., "Verification of Embedded Memory Systems using Efficient Memory Modeling", Proceedings of the Design, Automation and Test in Europe Conference and Exhibition (Date'05), vol. 2, 2005, 6 pages.
Mishchenko, Alan et al., "SAT-Based Complete Don't-Care Computation for Network Optimization", Proceedings of the conference on Design, Automation and Test in Europe (Date'05), vol. 1, 2005, 8 pages.

* cited by examiner

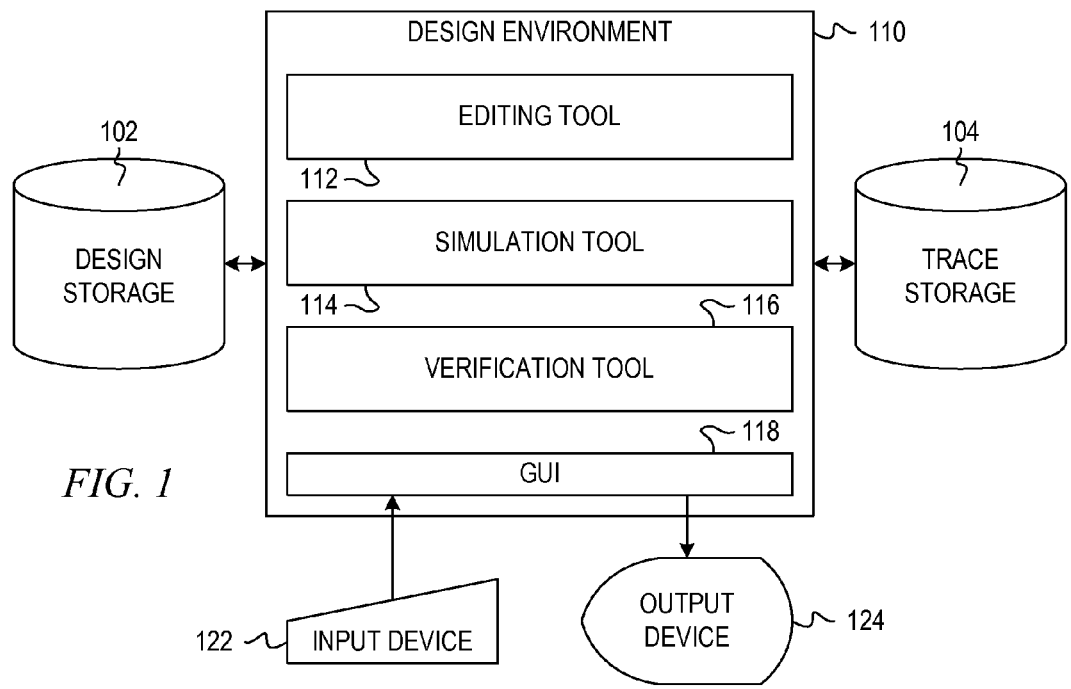

FIG. 1

FIG. 7 if address of port (p, t) is out of bounds or read_enable for port (p, t) is disabled, then select corresponding data pin of port (p, t);
else
if array type is write-before-read and any write port for time, t, is enabled for an address that matches the address of read port (p, t), then select the corresponding highest priority write data pin;
else
if any write port for time t-1 is enabled for an address that matches the address of read port (p, t), then select the corresponding highest priority write data pin;
else
...
if t>0 and any write port for time 0 is enabled for an address that matches the address of read port (p, t), then select the corresponding highest priority write data pin;
else
select corresponding data pin of port (p, t)

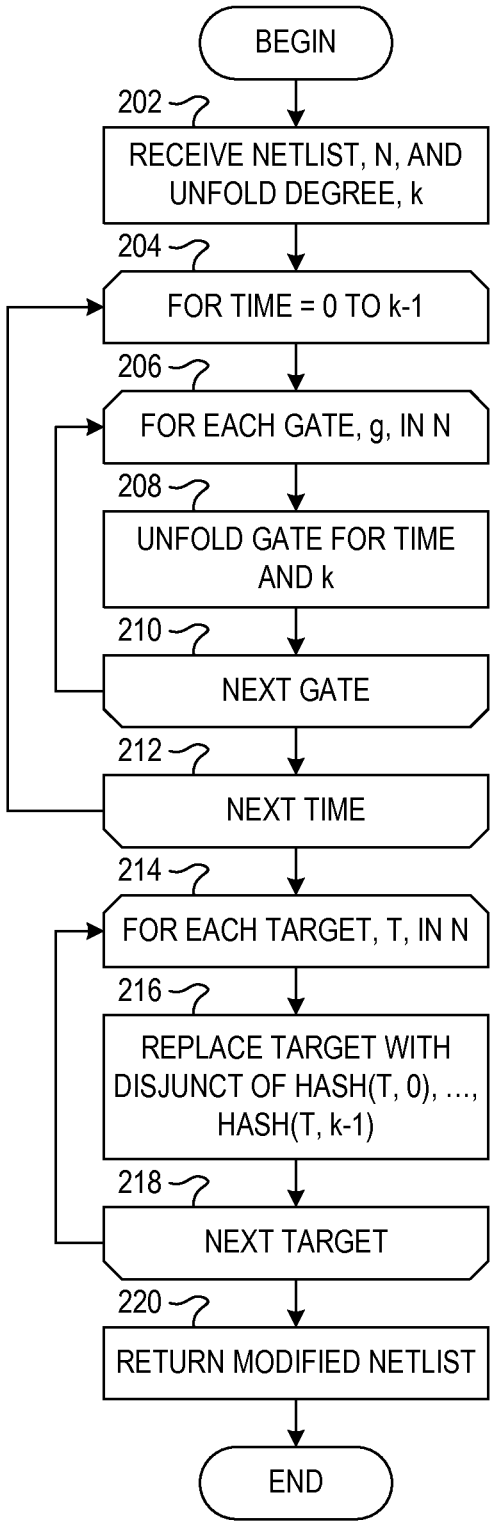

*FIG. 4*

```
netlist phase_abstract(netlist N, unfold_degree k) {
 for(t=0; t<k; t++) {
   for each gate "g" in N {
     unfold(g, t, k);
   } for each target "t" in N {
     replace t with the disjunction of hash(t, 0), ..., hash(t, k-1);
   }
 }
 return modified netlist;
} gate unfold(gate g, time t, unfold_degree k) {
 if (hash(g, t)) {
   return hash(g, t);
 } if (g is a register) {
   if (time == 0) {
     hash(g, t) = g;
     next_state(g) = unfold(next_state(g), k-1, k);
   }
   else {
     hash(g, t) = unfold(next_state(g), t-1, k);
   }
 }
 else if (g is a RANDOM gate) {
   hash(g, t) = create_random();
 }
 else {/* g is a combinational gate with function f (g) and inputs i0(g).. ij(g) */
   hash(g, t) = f(g)(unfold(i0(g), t, k), unfold(i1(g), t, k),..., unfold(ij(g), t, k));
 }
 return hash(g, t);
}
```

FIG. 6

```
Phase_abstract_array_netlist(netlist N, unfold_degree k) { for each array "a" in N {
  for(t=0; t<k; t++) {
   for each write port "p" in "a" {
    create new port (p, t) in "a"

for each enable, address, data pin "g" in "p" {
     assign corresponding pin of port (p, t) = unfold(g, t, k);
    }
   } for each read port "p" in "a" {
    create new port (p, t) in "a"

for each enable, address, data pin "g" in "p" {
     assign corresponding pin of port (p, t) = unfold(g, t, k);
    } for each data pin "g" in "p" {
     create multiplexor for structure;

hash(g, t) = the corresponding multiplexor output;
    }
   }
  }
  convert array type to read-before-write
 }

/* now that we have modified arrays and seeded references to read data pins, can run traditional phase_abstraction algorithm */
 return phase_abstract(N, k);
}
```

FIG. 10

```
trace undo_phase_abstraction(netlist N, unfold_degree k, trace p)
  trace new_trace;
  for each time "i" defined in trace {
    for each gate "g" in N {
      for (t=0; t<k; t++) {
        apply value of hash(g, t) in trace p at time i to gate g in trace new_trace at time "i*k + t"
      }
    }
  }
  return new_trace
}
```

FIG. 12

```
trace undo_phase_abstraction(netlist N, unfold_degree k, trace c)
  trace new_trace;
  for each time "i" defined in trace {
    if(i == 0) {
      for each (address, data, time==0) triple in the sparse array contents in c {
        inject (address, data, time==0) triple in the sparse array contents in new_trace
      }
    } for(t=0; t<k; t++) {
      for each gate "g" in N {
        apply value of hash(g, t) in trace c at time i to gate g in trace new_trace at time "i*k + t"
      }
      for each write port (p, t) from lower to higher precedence {
        if enable pin of (p, t) is asserted {
          inject sparse array content (address, data, "i*k + t + (array is write-before read? 1:0)")
triple in the sparse array contents of new_trace
        }
      }
    }
  }
  return new_trace
}
```

ENHANCED ANALYSIS OF ARRAY-BASED NETLISTS VIA PHASE ABSTRACTION

BACKGROUND

The present application relates generally to an improved data processing apparatus and method and more specifically to mechanisms for enhanced analysis of array-based netlists via phase abstraction.

Formal and semiformal verification techniques are powerful tools for the construction of correct logic designs. They have the power to expose even the most probabilistically uncommon scenario that may result in a functional design failure, and ultimately have the power to prove that the design is correct, i.e. that no failing scenario exists. Unfortunately, formal verification techniques require computational resources that are exponential with respect to the size of the design under test. Semiformal verification techniques leverage formal algorithms to larger designs by applying them only in a resource-bounded manner, though at the expense of incomplete verification coverage.

U.S. Pat. No. 6,698,003 proposes the generic concept of "transformation-based verification" to enable the use of multiple algorithms, encapsulated as "engines" of a modular multiple-engine based verification system to synergistically simplify and decompose complex problems into simpler subproblems that are easier to formally discharge. The transformation-based verification paradigm has demonstrated itself essential to enhance the scalability of formal verification algorithms to verification problems of industrial relevance, where it is often desired to leverage the bug-hunting power of formal methods to large units of logic that are the common focus of simulation-based test benches.

One large capacity gap between traditional formal verification algorithms and simulation-based testbenches is due to bit-blasting employed in the former. In particular, virtually every industrial hardware formal verification tool "bit-blasts" design components into simpler primitives, such as two-input AND gates, inverters, and single-bit state elements. In contrast, logic simulators often support higher-level primitives without bit-blasting. One type of design component that often entails a dramatic bloat when bit-blasted is a memory array, which is a row-addressable, two-dimensional state element often used to represent main memory or caches. Such memory arrays may be extremely large when bit-blasted. Modern caches often are several megabytes, and if verifying a design component that interacts with main memory, it may even be required to support more than $2^{32}$ rows of arbitrary width. Bit-blasting of such large memory arrays often constitutes a fatal bottleneck to formal verification tools.

Phase abstraction is a technique to reduce the size of a hardware design by unfolding the next-state functions of state-holding elements, such that one time-step/transition of the resulting phase-abstracted design correlates to multiple transitions of the original design. Phase abstraction is capable of reducing the number of state elements of a design, which is advantageous in enabling various verification and synthesis frameworks to be more efficient. However, no prior art solutions address the use of phase abstraction in a verification tool that natively supports memory arrays.

SUMMARY

In one illustrative embodiment, a method, in a data processing system, is provided for performing phase abstraction on an integrated circuit design with a memory array. The method comprises receiving, by the data processing system, a netlist for an integrated circuit design. The netlist comprises a memory array. The method further comprises for a given memory array in the netlist, duplicating each write port of the given memory array for a plurality of time values up to an unfold degree to form a plurality of write ports and unfolding each enable pin, address pin, and data pin in each write port within the plurality of write ports. The method further comprises for the given memory array in the netlist, duplicating each read port of the given memory array for the plurality of time values to form a plurality of read ports and unfolding each enable pin, address pin, and data pin in each read port within the plurality of read ports. The method further comprises for each data pin of the plurality of read ports, creating a multiplexor structure to form a phase abstracted integrated circuit design. The multiplexor structure selects an output of the data pin based on whether an address of the read port is out-of-bounds, whether the read port is enabled, and whether the memory array is a write-before-read array. The method further comprises outputting, by the data processing system, the phase abstracted integrated circuit design.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 1 is a block diagram illustrating an example design environment in accordance with an illustrative embodiment;

FIG. 2 is a flowchart illustrating operation of a verification tool performing phase abstraction in accordance with an illustrative embodiment;

FIG. 4 depicts pseudo-code for the operations illustrated in FIGS. 2 and 3 in accordance with an example embodiment;

FIG. 6 depicts pseudo-code for the operations illustrated in FIG. 5 in accordance with an example embodiment;

FIG. 7 depicts pseudo-code for the multiplexor structure in accordance with an example embodiment;

FIG. 10 depicts pseudo-code for the operations illustrated in FIG. 9 in accordance with an example embodiment;

FIG. 12 depicts pseudo-code for the operations illustrated in FIG. 11 in accordance with an example embodiment;

DETAILED DESCRIPTION

Figure 3:
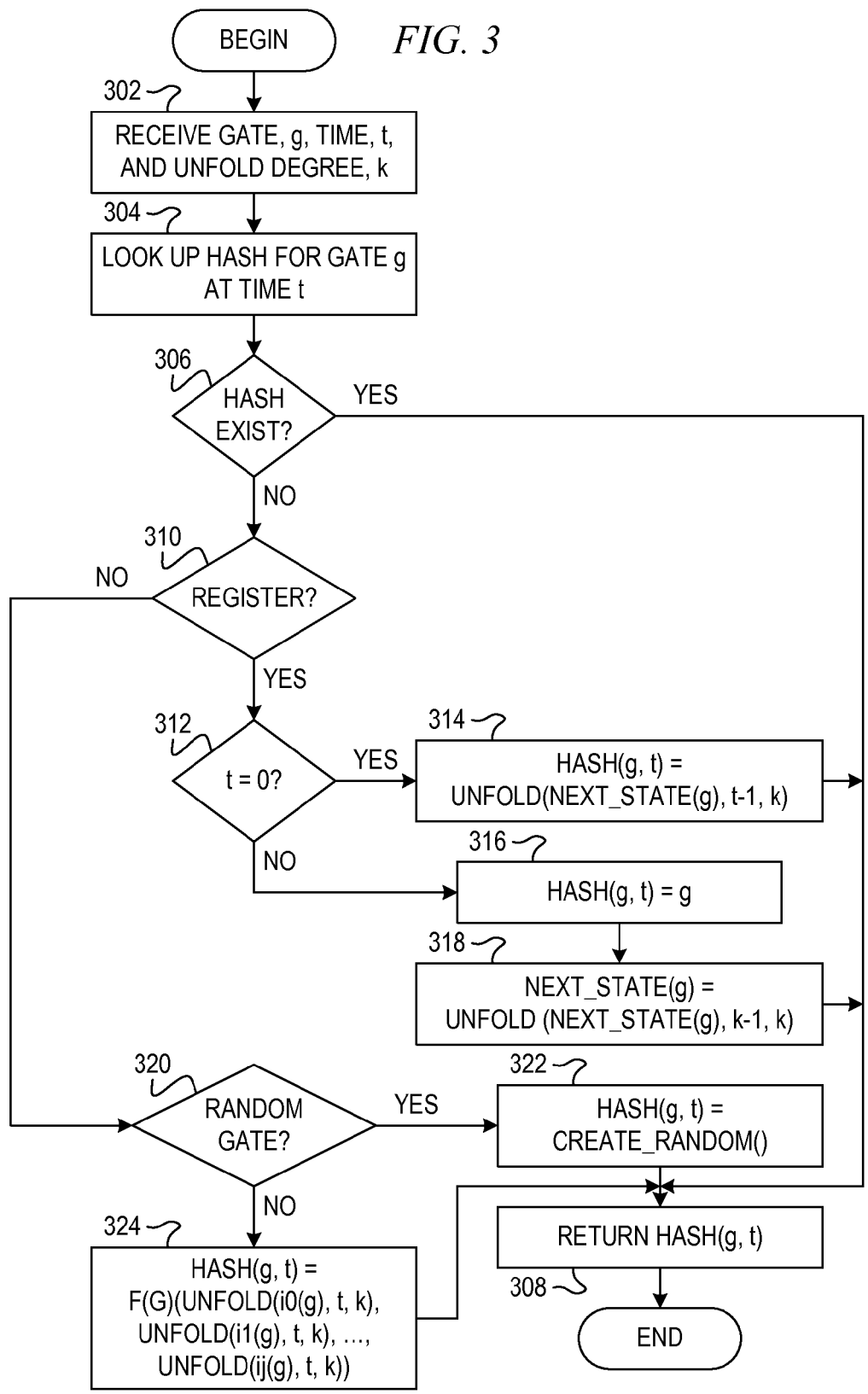
FIG. 3 is a flowchart illustrating operation of a verification tool performing an unfold function in accordance with an illustrative embodiment.

The illustrative embodiments provide a mechanism for increasing the scalability of transformation-based formal verification solutions through enabling the use of phase abstraction on logic models that include memory arrays. The mechanism manipulates the array to create a plurality of copies of its read and write ports, representing the different modulo time frames. The mechanism converts all write-before-read arrays to read-before-write and adds a bypass path around the array from write ports to read ports to capture any necessary concurrent read and write forwarding. The mechanism uses an additional set of bypass paths to ensure that the proper write data that becomes effectively concurrent through the unfolding inherent in phase abstraction is forwarded to the proper read port. Where a read fails to match a recent write that becomes concurrent due to unfolding, the mechanism fetches contents directly through the dedicated unfolded read port on the array. If a given read port is disabled or fetches out-of-bounds data, the mechanism applies randomized data to the read port data output.

FIG. 1 is a block diagram illustrating an example design environment in accordance with an illustrative embodiment. When designing an integrated circuit, a designer may first write a high-level description of the circuit in a hardware description language (HDL), such as Very High-Speed Integrated Circuit (VHSIC) Hardware Description Language (VHDL) or Verilog. In electronics, a hardware description language may be any language from a class of computer languages and/or programming languages for formal description of electronic circuits, and more specifically, digital logic. A HDL can describe the operation of a circuit, its design and organization, and tests to verify its operation by means of simulation. Most designs begin as a set of requirements or a high-level architectural diagram. The designer often prototype control and decision structures in flowchart applications or enter them in a state-diagram editor. The process of writing the HDL description is highly dependent on the nature of the circuit and the designer's preference for coding style.

Design environment 110 may include editing tool 112, simulation tool 114, verification tool 116, and graphical user interface (GUI) 118. A circuit designer may create and edit an integrated circuit (IC) design, which may be written in a high-level HDL, such as VHSIC or Verilog, and store the IC design in design storage 102. The circuit designer may interact with editing tool 112 via graphical user interface (GUI) 118 using input device 122 and output device 124.

Simulation tool 114 simulates operation of an IC circuit from design storage 102. The designer may control simulation tool 114 via GUI 118 using input device 122 and output device 124. Simulation tool 114 stores trace results in trace storage 104. Simulation tool 114 is a primary tool for verifying the logical correctness of a design. In many cases logic simulation is the first activity performed in the process of taking a hardware design from concept to realization. Modern hardware description languages are both simulatable and synthesizable.

Simulation is a natural way for the designer to get feedback about a design. Because simulation tool 114 executes as a program, the designer interacts with the simulation using the vocabulary and abstractions of the design. There is no layer of translation to obscure the behavior of the design. The level of effort required to debug and then verify the design is proportional to the maturity of the design. That is, early in the life of the design, the designer may find bugs and incorrect behavior quickly. Simulation is completely general; any hardware design can be simulated. The only limits are time and computer resources in design environment 110.

Verification tool 116 allows the designer to verify an IC design from design storage 102. A manufacturer may establish and maintain procedures for verifying an IC design. Design verification confirms that the design output meets the design input requirements. Verification tool 116 compares design outputs to design input requirements to determine whether the requirements have been met. The designer may control verification tool 116 via GUI 118 using input device 122 and output device 124. Formal and semiformal verification techniques are powerful tools for the construction of correct logic designs. They have the power to expose even the most probabilistically uncommon scenario that may result in a functional design failure, and ultimately have the power to prove that the design is correct, i.e. that no failing scenario exists.

A netlist contains a directed graph with vertices representing gates and edges representing interconnections between those gates. The gates have associated functions, such as constants, primary inputs (hereafter referred to as RANDOM gates), combinational, logic such as AND gates, simple sequential elements (hereafter referred to as registers), and memory arrays. Registers have two associated components: their next-state functions and their initial-value functions. The netlist represents both components as other gates in the graph. Semantically, for a given register, the value appearing at its initial-value gate at time "0" ("initialization" or "reset" time) is applied as the value of the register itself; the value appearing at its next-state function at time "i" is applied to the register itself at time "i+1".

Memory arrays represent two-dimensional grids of registers, arranged as rows vs. columns. A circuit reads or writes the contents of memory arrays via dedicated "ports" of three types: read ports, initialization ports, and write ports. Ports of these three types have three components: an address, a data vector, and an enable. The address indicates which row is to be accessed. The enable indicates whether or not the given port is being accessed. The data vector indicates what value is to be written to the given row (if enabled) in the case of a write port or the contents present for the given row of an enabled read. Initialization ports are specialized write ports that are relevant only at time 0.

Memory arrays have a pre-defined number of rows and columns, a default initial value (in case of an unwritten row is read), and an indication of read-before-write vs. write-before read behavior. The latter is relevant in case of a concurrent read and write to the same address: read-before-write will not return the concurrent write data, whereas write-before-read will. The memory array will often conservatively randomize data contents of a read port in case the read enable is not active, or in case the read row is "out-of-bounds," i.e. the read address is larger than the pre-defined number of rows for the array. Write ports and initialization ports have a pre-defined precedence defining which values will persist in case of multiple concurrent writes or initializations to the same address. Port precedence is irrelevant for read ports; every concurrent read to a given address returns the same data, which is the highest-priority write to the given address in the case of write-before-read, else the highest-priority most recent write to that address if any exist, else the highest-priority initialization to that address if any such initialization ports exist, else the default initial value.

Certain gates in a netlist are labeled as "targets." Targets correlate to the properties one wishes to verify; the goal of the verification process is to find a way to drive a "1" to a target node (and to generate a "trace" illustrating this scenario if one is found), or to prove that no such assertion of the target is possible.

Phase abstraction is a transformation that "accelerates" or "collapses" state transitions of a netlist. In particular, given k-based abstraction, every next-state function transition of the phase-abstracted design correlates to "k" transitions of the original design. This transformation may greatly enhance design verification because it may reduce the number of registers in a netlist and may eliminate the need to model oscillating clocks and multiple time-frame clock periods. However, prior art phase-abstraction techniques only address the use of phase abstraction for bit-blasted netlists. Prior art phase-abstraction techniques do not address the use of phase abstraction for netlists with memory arrays.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smafltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium product an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

FIG. 2 is a flowchart illustrating operation of a verification tool performing phase abstraction in accordance with an illustrative embodiment. Operation begins, and the verification tool receives a netlist, N, and an unfold degree, k (block 202). For each time from 0 to k−1 (block 204) and for each gate, g, in the netlist, N (block 206), the verification tool unfolds the gate for the time and the unfold degree (block 208). Operation of the verification tool performing an unfold function on a gate is described in further detail below with respect to FIG. 3. The verification tool then considers the next gate (block 210), and operation returns to block 206 to repeat the loop for the next gate. If the verification tool considers the last gate in the netlist in block 210, the verification tool considers the next time (block 212), and operation returns to block 204 to repeat the loop for the next time value.

If the verification tool considers the last time from 0 to k−1 in block 212, then for each target, T, in the netlist, N (block 214), the verification tool replaces the target with a disjunct of a hash function of the target from 0 to k−1 (block 216). The verification tool considers the next target (block 218), and operation returns to block 214 to repeat the loop for the next target. If the verification tool considers the last target in the netlist in block 218, the verification tool returns the modified netlist (block 220), and operation ends.

FIG. 3 is a flowchart illustrating operation of a verification toot performing an unfold function in accordance with an illustrative embodiment. Operation begins, and the verification tool receives a gate, g, a time, t, and an unfold degree, k (block 302). The verification tool looks up a hash for g at time t in a hash table (block 304). The verification tool determines whether a hash exists (block 306). If a hash exists for the gate at time t, the verification tool returns the hash (block 308), and operation ends.

If a hash does not exist in the hash table in block 306, the verification tool determines whether g is a register (block 310). If g is a register, the verification tool determines whether t=0 (block 312). If t=0, the verification tool sets the hash to the result of performing the unfold function on the gate g at time t−1 with unfold degree of k (block 314), which calls the flowchart of FIG. 3 recursively. Thereafter, the verification tool returns the hash (block 308), and operation ends.

If the time, t, does not equal zero in block 312, the verification tool sets the hash to the gate, g (block 316). Then, the verification tool sets the next_state function of g to the result of performing the unfold function on the gate G at time k−1 with an unfold degree of k (block 318), which calls the flowchart of FIG. 3 recursively. Thereafter, the verification tool returns the hash (block 308), and operation ends.

Returning to block 310, if g is not a register, the verification tool determines whether g is a random gate (block 320). If g is a random gate, the verification tool sets the hash to a newly created random (block 322). Thereafter, the verification tool returns the hash (block 308), and operation ends.

If g is not a random gate in block 320, then the gate is a combinational gate with function f(g) and inputs i0(g) . . . ij(g). The verification tool sets the hash to f(g)(unfold(i0(g), t, k), unfold(i1(g), t, k), . . . , unfold(ij(g), t, k) (block 324), which calls the flowchart of FIG. 3 recursively for each input of the combinational gate. Thereafter, the verification tool returns the hash (block 308), and operation ends.

FIG. 4 depicts pseudo-code for the operations illustrated in FIGS. 2 and 3 in accordance with an example embodiment. Note that phase abstraction creates "k" copies of each gate in the netlist. Intuitively, these represent the behavior of the gates of the original circuit at different modulo-k time frames. For example, given k=2, one copy represents even time frames 0, 2, 4, etc., whereas the other copy represents odd time frames 1, 3, 5, etc. For this reason, targets in the original netlist are replaced with disjunctions (logical ORs) over each copy in the phase-abstracted netlist so that target assertions that may occur only at specific modulo-k time frames are all accounted for. The unfolding used to copy gates in phase abstraction basically clones combinational gates and inputs for the specific modulo-k time frame, but treats registers in a specific way. Time zero unfolding retains a reference to the register but replaces its next-state function by the time k−1 unfolded version of the next-state function. Time greater than zero unfolding reference the next-state functions for the decremented time frame.

In accordance with an illustrative embodiment, a mechanism efficiently performs phase abstraction for netlists with memory arrays. For efficiency, the verification tool of the illustrative embodiment does not bit-blast arrays. Additionally, the mechanism of the illustrative embodiment entails minimal logic increase to perform phase abstraction of netlists with arrays. Therefore, the mechanism of the illustrative embodiment does not need to create multiple copies of the memory arrays.

When phase abstracting a memory array, it is critical to ensure that write ports are modified to reflect all writes that may occur during k consecutive time frames and that read ports are modified to reflect all reads that may occur during k consecutive time frames. However, ensuring the above using standard memory array constructs is tricky given that data consistency must be strictly preserved. That is, the mechanism cannot allow read ports for "older" time frames (smaller unfolding times) to return write data for "newer" time frames (larger unfolding times).

Figure 5:
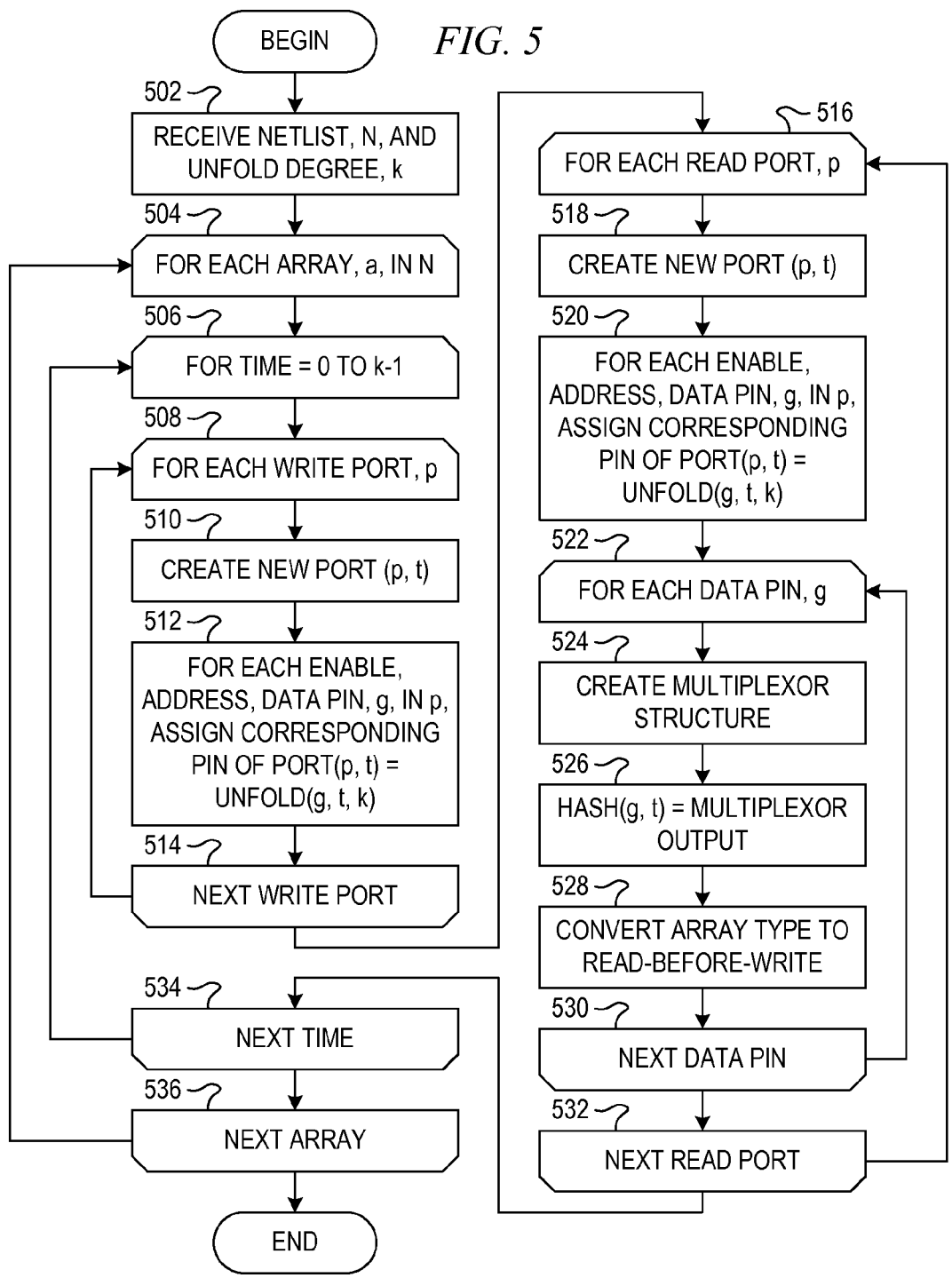
FIG. 5 is a flowchart illustrating operation of a verification tool for performing phase abstraction of a netlist with memory arrays in accordance with an illustrative embodiment.

FIG. 5 is a flowchart illustrating operation of a verification tool for performing phase abstraction of a netlist with memory arrays in accordance with an illustrative embodiment. Operation begins, and the verification tool receives a netist, N, and an unfold degree, k (block 502). For each array, a, in N (block 504), for time, t, equals zero to k−1 (block 506), and for each write port, p (block 506), the verification tool creates a new write port (p, t) (block 510). Then, for each enable, address, and data pin, g, in p, the verification tool assigns a corresponding pin of port (p, t) equal to the result of unfolding g for time t and unfold degree k (block 512). The verification tool considers the next write port (block 514), and operation returns to block 508 to repeat the loop for the next write port.

If the verification tool considers the last write port in block 514, then for each read port, p (block 516), the verification tool creates a new read port (p, t) (block 518). Then, for each enable, address, and data pin, g, in p, the verification tool assigns a corresponding pin of port (p, t) to the result of unfolding g for time t and unfold degree k (block 520). Then, for each data pin, g (block 522), the verification tool creates a multiplexor structure (block 524).

FIG. 7 depicts pseudo-code for the multiplexor structure in accordance with an example embodiment. Note that the pseudo-code includes iterations for the write port from time t−1, t−2, . . . , 1, then considers the case that t>0 and any write port for time 0 is enabled for an address that matches the address of the read port. The verification tool then sets the hash of the gate, g, at time, t equal to the multiplexor output (block 526). The verification tool converts the array type to read-before-write if the array type is write-before-read (block 528). Then, the verification tool considers the next data pin (block 530), and operation returns to block 522 to repeat the loop for the next data pin. If the verification tool considers the last data pin in block 530, the verification tool considers the next read port (block 532), and operation returns to block 516 to repeat the loop for the next read port.

If the verification tool considers the last read port in block 532, the verification tool considers the next time (block 534), and operation returns to block 506 to repeat the loop for the next time value. If the verification tool considers the last time value in block 534, the verification tool considers the next array (block 536), and operation returns to block 504 to repeat the loop for the next array. If the verification tool considers the last array in block 536, then operation ends.

FIG. 6 depicts pseudo-code for the operations illustrated in FIG. 5 in accordance with an example embodiment. The verification tool manipulates the array to create k copies of its read and write ports, representing the different modulo-k time frames. Note that initialization data need not be altered. However merely creating copies of read and write ports would violate data consistency properties in several ways, requiring numerous intricacies to operate properly. For write-before-read arrays, there is a risk that "older" read ports for earlier read port unfolding may return "newer" write data for later write port unfolding. To circumvent this risk, the mechanism of the illustrative embodiment converts all write-before-read arrays to read-before-write arrays. Additionally, the mechanism adds a bypass path around the array, from write ports to read ports, to capture any necessary concurrent read and write forwarding.

Furthermore, there would be no differentiation in the data returned by read ports for differing time frame unfolding, even though reads of a given address across different time unfolding of read ports must reflect data from the appropriate and differing corresponding write port unfolding. More specifically, there is a risk that a "newer" unfolded read port may fail to return data written by a "later" unfolded write port, instead returning stale data from a prior time frame. The mechanism of the illustrative embodiments uses an additional set of bypass paths to ensure that the proper write data that becomes effectively concurrent through the unfolding inherent in phase abstraction (and visible only "strictly later" due to the read-before-write nature) is forwarded to the proper read port.

Still further, where a read fails to match a recent write that becomes concurrent due to the unfolding, the mechanism fetches contents directly through the dedicated unfolded read port on the array. This choice serves to dramatically simplify trace regeneration, as well as to reduce the size of the phase abstracted netlist. If a given read port is disabled or fetches out-of-bounds data, the mechanism applies randomized data to the read port data output. A tempting choice, more akin to how array data is represented for bounded symbolic analysis, would be to directly instantiate RANDOM gates within the multiplexor structure for these cases. However, doing this increases logic, size of the phase-abstracted netlist, and some verification techniques, such as those based on binary decision diagrams, are particularly sensitive to the number of RANDOM gates. In contrast, subsequent analysis of the phase abstracted array will by construction need to be able to handle disabled or out-of-bounds address randomization, inasmuch as such would need to be handled given a non-phase abstracted netlist. Overall, with the proper array manipulation and "seeding" of the hash data structure, the mechanism of the illustrative embodiments enables efficient phase abstraction of netlists with arrays.

Figure 8A:
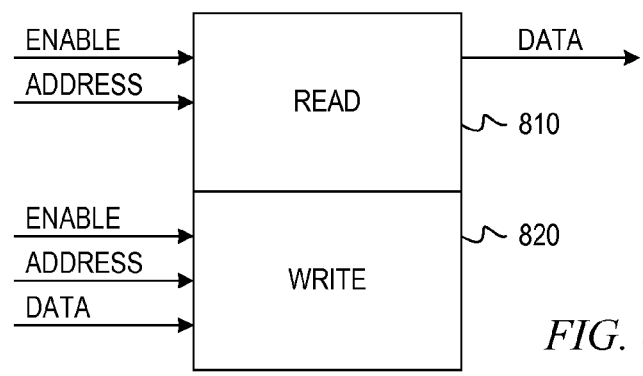
FIGS. 8A and 8B are a visual depiction of a phase abstraction transformation of a memory array in accordance with an illustrative embodiment.
Figure 8B:
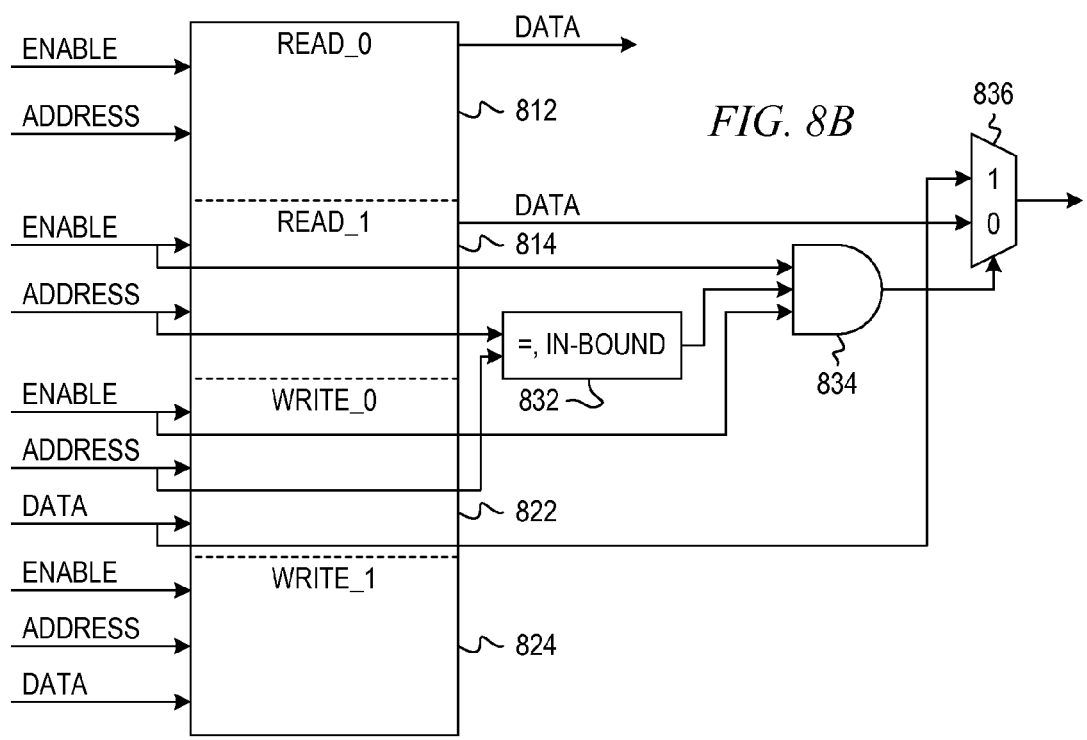

FIGS. 8A and 8B are a visual depiction of a phase abstraction transformation of a memory array in accordance with an illustrative embodiment. FIG. 8A depicts an original read-before-write array with a single read port 810 and a single write port 820. FIG. 8B depicts the phase-abstracted variant for k=2, which has two read ports and two write ports. Read port 812 and write port 822 represent even time frames, while read port 814 and write port 824 represent odd time frames. Because read port 814 represents odd time frames and must reflect writes that may have occurred on the prior even time frame, the phase-abstracted variant depicted in FIG. 8B has a bypass path from write port 822 to read port 814, which forwards the given write data if the addresses match and are in-bound, as determined by component 832, and both the read and write enable are asserted, as determined by AND gate 834. Multiplexor 836 behaves as described above and as depicted in FIG. 7.

Figure 9:
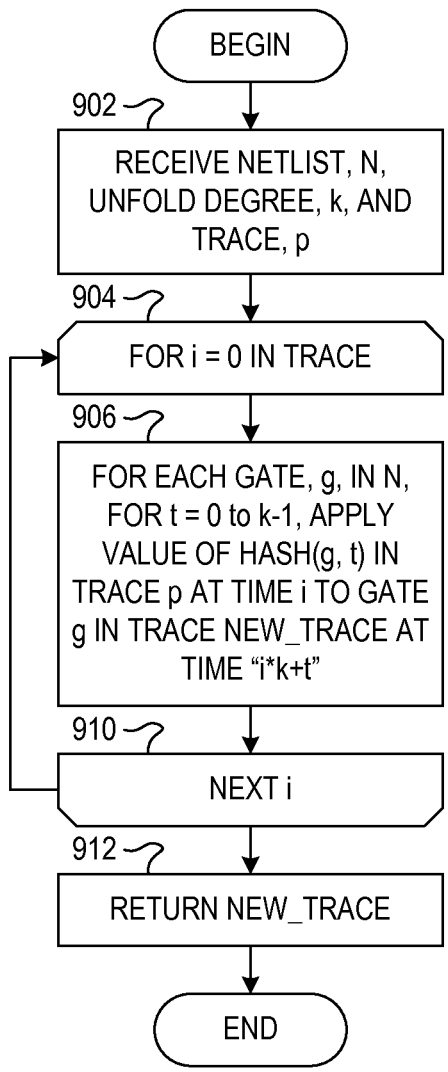
FIG. 9 is a flowchart illustrating operation of a verification tool eliminating effects of phase abstraction in accordance with an illustrative embodiment.

In accordance with an illustrative embodiment, a mechanism is provided to undo the effects of phase abstraction on verification results. In particular, the nature of phase abstraction renders traces illustrating target assertions, not directly representative of the behavior of the original netlist. FIG. 9 is a flowchart illustrating operation of a verification tool eliminating effects of phase abstraction in accordance with an illustrative embodiment. Operation begins, and the verification tool receives a netlist, N, an unfold degree, k, and a trace, p (block 902). For each time, i, defined in the trace (block 904), and for each gate, g, in N, and for each time t from 0 to k−1, the verification tool applies the value in the hash table for gate g at time t in trace p at time i to gate g in trace new_trace at time "i*k+1" (block 906). The verification tool considers the next time, i, in the trace (block 910), and operation returns to block 904 to repeat the loop for the next time i. If the verification tool considers the last time in the trace in block 910, the verification tool returns trace, new_trace (block 912), and operation ends.

FIG. 10 depicts pseudo-code for the operations illustrated in FIG. 9 in accordance with an example embodiment. While the example depicted in FIGS. 9 and 10 is applicable to netlists with arrays, it is not adequate because in the presence of arrays, it is often desired to represent the contents of the arrays as a "sparse" format as a sequence of (address, data, time) triples. The phase-abstracted netlist has only a single array, unlike other gates which are replicated "k" times.

Figure 11:
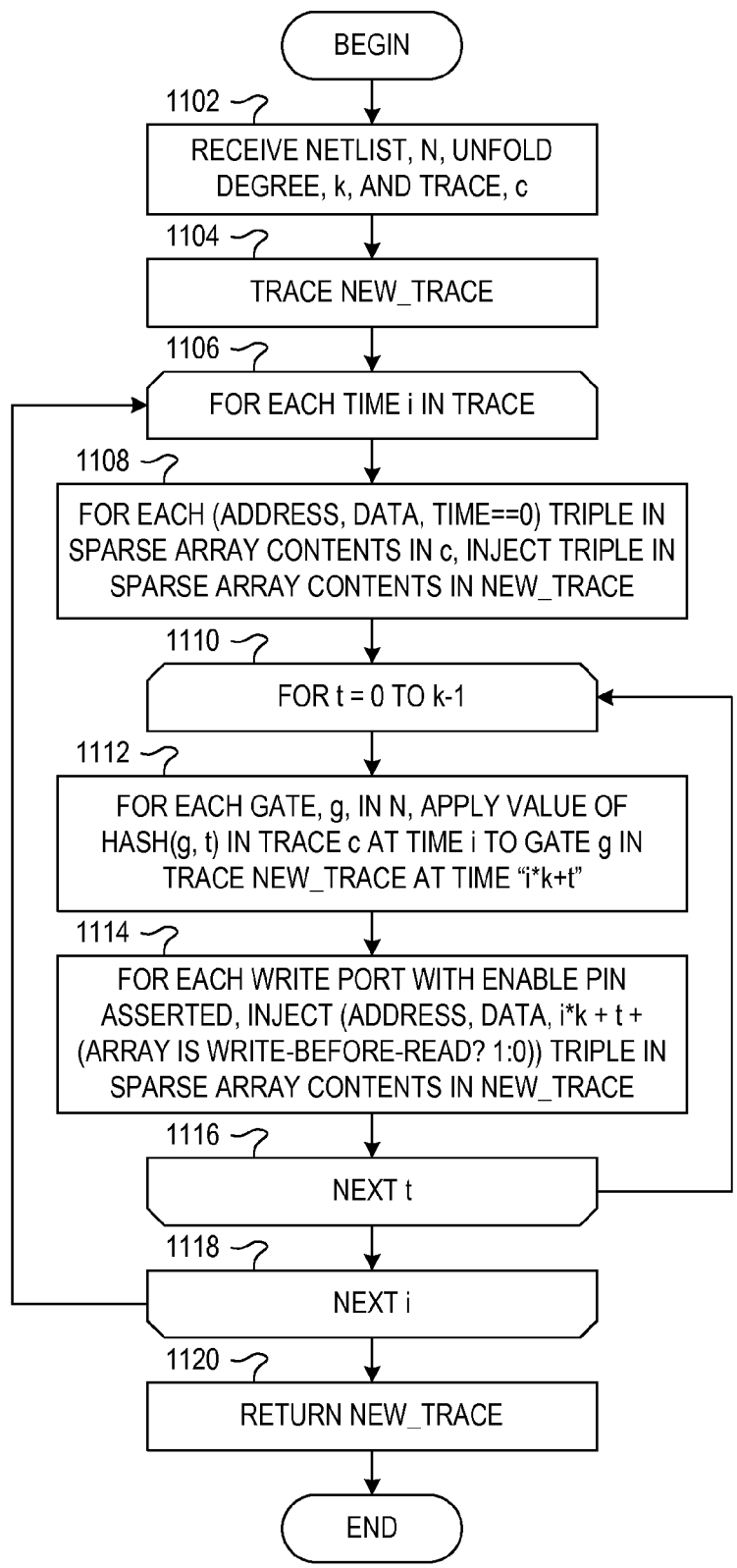
FIG. 11 is a flowchart illustrating operation of a verification tool eliminating effects of phase abstraction on memory arrays in accordance with an illustrative embodiment.

FIG. 11 is a flowchart illustrating operation of a verification tool eliminating effects of phase abstraction on memory arrays in accordance with an illustrative embodiment. Operation begins, and the verification tool receives a netlist, N, an unfold degree, k, and a trace, c (block 1102). The verification tool creates a trace, new_trace (block 1104). For each time, i, in the trace (block 1106), for each (address, data, time=0) triple in the sparse array contents in c, the verification tool injects the triple in the sparse array contents in new_trace (block 1108).

Then, for each time, t, from 0 to k−1 (block 1110), for each gate, g, in N, the verification tool applies the value of hash of g and t in trace c at time i to gate g in trace new_trace at time "i*k+t" (block 1112). For each write port with the enable pin asserted, the verification tool injects a triple in the sparse array contents in new_trace, where the triple is the (address, data, i*k+t+1) if the array is write-before-read or (address, data, i*k+t) if the array is read-before-write (block 1114). Then, the verification tool considers the next time, t (block 1116), and operation returns to block 1110 to repeat the loop for the next time, t.

If the verification tool considers the last time, t, in block 1116, then the verification tool considers the next time, i, in the trace (block 1118), and operation returns to block 1106 to repeat the loop for the next time, i. If the verification tool considers the last time, i, in block 1118, the verification tool returns new_trace (block 1120), and operation ends.

FIG. 12 depicts pseudo-code for the operations illustrated in FIG. 11 in accordance with an example embodiment. The extension to trace lifting required to support arrays has two components. The first component directly applies time-0 values from the phase abstracted trace "c" to time-0 values in the new un-phase abstracted trace, new_trace. This is a valid step, because default initial values and initialization ports are unaffected by phase abstraction. These values are the source of some of the time-0 sparse array contents in c. The remaining time-0 sparse array contents in c are due to time-0 writes in write-before-read arrays. For read-before-write arrays, often the new values do not appear until the time frame after which the write occurs, similar to the modeling of "registers." However, recall that the phase abstracted netlist is never of type write-before-read. Hence, time-0 sparse array contents for the phase abstracted trace never reflect writes.

The second component of array support in trace lifting is to take writes into account. The extension to trace lifting described above takes writes into account through interpretation of write port valuations, directly within the trace lifting loop, to compute which values are to be written into the sparse array contents at which times.

In accordance with an illustrative embodiment, the verification tool optimizes the phase abstracted arrays. A byproduct of phase abstraction is that the numbers of read and write ports are multiplied by the unfold degree. In cases, these additional read and write ports are all necessary. In many case, however, some of these additional ports may be superfluous in the context of the phase abstracted netlist and may be eliminated to further compress the netlist size. Therefore, the verification tool may perform optimizations to eliminate redundant post-phase abstraction array ports.

If the "enable" of any port is semantically equivalent to 0, then that port may be eliminated. This arises in practice, because write-enables are occasionally ANDed with clock signals so that writes only occur on a single phase of the clock period. Unfolded ports for other phases become irrelevant.

If the "enable" and "address" connections of any two ports of the same time are identical, the lower-precedence port may be eliminated. This arises in practice, because the signals that drive these connections are often latched, and latches may only toggle once per clock period; hence, the unfolded gates in the fanout of these latches may often be identical.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 13:
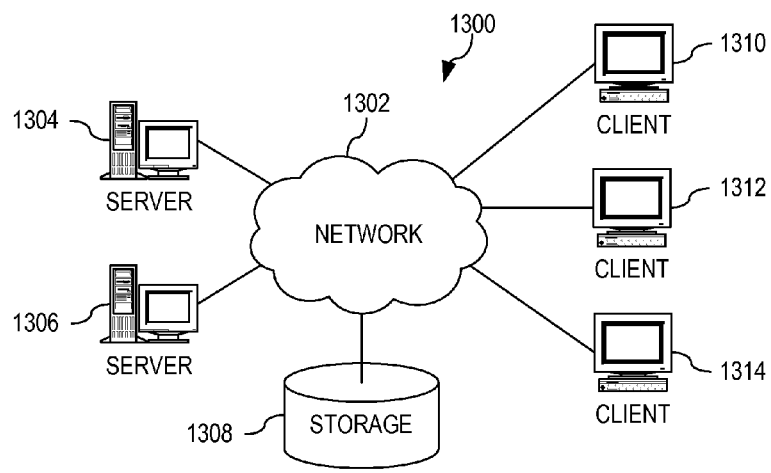
FIG. 13 depicts a pictorial representation of an example distributed data processing system in which aspects of the illustrative embodiments may be implemented.
Figure 14:
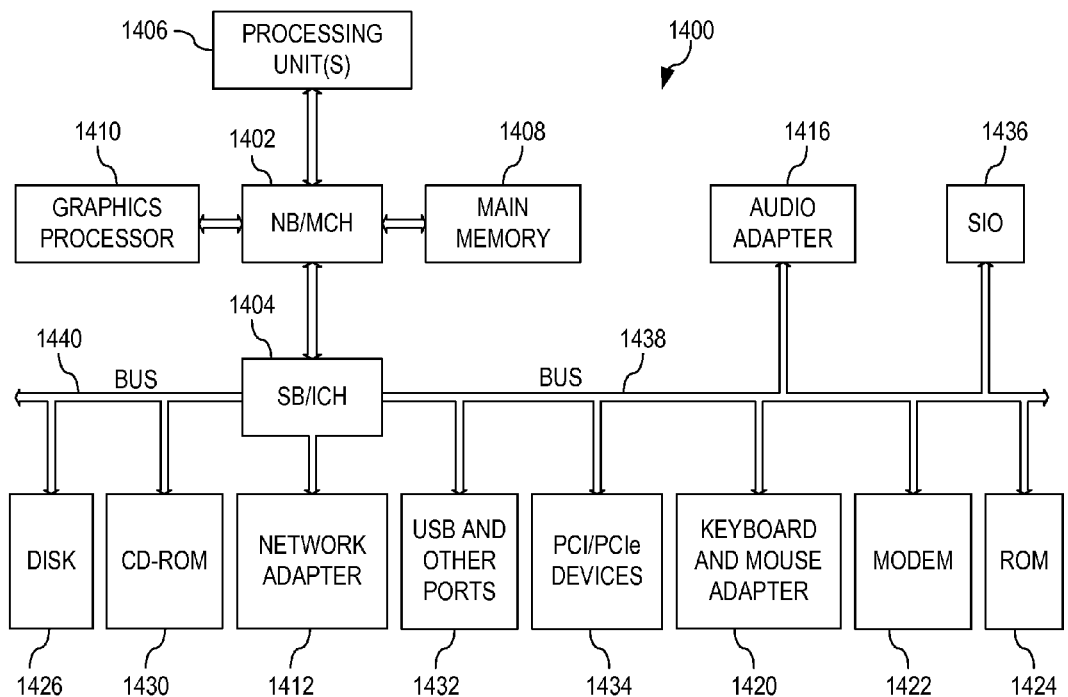
FIG. 14 is a block diagram of an example data processing system in which aspects of the illustrative embodiments may be implemented.

The illustrative embodiments may be utilized in many different types of data processing environments including a distributed data processing environment, a single data processing device, or the like. In order to provide a context for the description of the specific elements and functionality of the illustrative embodiments, FIGS. 13 and 14 are provided hereafter as example environments in which aspects of the illustrative embodiments may be implemented. While the description following FIGS. 13 and 14 will focus primarily on a single data processing device implementation, this is only an example and is not intended to state or imply any limitation with regard to the features of the present invention. To the contrary, the illustrative embodiments are intended to include distributed data processing environments and embodiments.

With reference now to the figures and in particular with reference to FIGS. 1.3 and 14, example diagrams of data processing environments are provided in which illustrative embodiments of the present invention may be implemented. It should be appreciated that FIGS. 13 and 14 are only examples and are not intended to assert or imply any limitation with regard to the environments in which aspects or embodiments of the present invention may be implemented. Many modifications to the depicted environments may be made without departing from the spirit and scope of the present invention.

FIG. 13 depicts a pictorial representation of an example distributed data processing system in which aspects of the illustrative embodiments may be implemented. Distributed data processing system 1300 may include a network of computers in which aspects of the illustrative embodiments may be implemented. The distributed data processing system 1300 contains at least one network 1302, which is the medium used to provide communication links between various devices and computers connected together within distributed data processing system 1300. The network 1302 may include connections, such as wire, wireless communication links, or fiber optic cables.

In the depicted example, server 1304 and server 1306 are connected to network 1302 along with storage unit 1308. In addition, clients 1310, 1312, and 1314 are also connected to network 1302. These clients 1310, 1312, and 1314 may be, for example, personal computers, network computers, or the like. In the depicted example, server 1304 provides data, such as boot files, operating system images, and applications to the clients 1310, 1312, and 1314. Clients 1310, 1312, and 1314 are clients to server 1304 in the depicted example. Distributed data processing system 1300 may include additional servers, clients, and other devices not shown.

In the depicted example, distributed data processing system 1300 is the Internet with network 1302 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 1300 may also be implemented to include a number of different types of networks, such as for example, an intranet, a local area network (LAN), a wide area network (WAN), or the like. As stated above, FIG. 13 is intended as an example, not as an architectural limitation for different embodiments of the present invention, and therefore, the particular elements shown in FIG. 13 should not be considered limiting with regard to the environments in which the illustrative embodiments of the present invention may be implemented.

With reference now to FIG. 14, a block diagram of an example data processing system is shown in which aspects of the illustrative embodiments may be implemented. Data processing system 1400 is an example of a computer, such as client 1310 in FIG. 13, in which computer usable code or instructions implementing the processes for illustrative embodiments of the present invention may be located.

In the depicted example, data processing system 1400 employs a hub architecture including north bridge and memory controller hub (NB/MCH) 1402 and south bridge and input/output (I/O) controller hub (SB/ICH) 1404. Processing unit 1406, main memory 1408, and graphics processor 1410 are connected to NB/MCH 1402. Graphics processor 1410 may be connected to NB/MCH 1402 through an accelerated graphics port (AGP).

In the depicted example, local area network (LAN) adapter 1412 connects to SB/ICH 1404. Audio adapter 1416, keyboard and mouse adapter 1420, modem 1422, read only memory (ROM) 1424, hard disk drive (HDD) 1426, CD-ROM drive 1430, universal serial bus (USB) ports and other communication ports 1432, and PCI/PCIe devices 1434 connect to SB/ICH 1404 through bus 1438 and bus 1440. PCI/PCIe devices may include, for example. Ethernet adapters, add-in cards, and PC cards for notebook computers. PCI uses a card bus controller, while PCIe does not. ROM 1424 may be, for example, a flash basic input/output system (BIOS).

HDD 1426 and CD-ROM drive 1430 connect to SB/ICH 1404 through bus 1440. HDD 1426 and CD-ROM drive 1430 may use, for example, an integrated drive electronics (IDE) or serial advanced technology attachment (SATA) interface. Super I/O (SIO) device 1436 may be connected to SB/ICH 1404.

An operating system runs on processing unit 1406. The operating system coordinates and provides control of various components within the data processing system 1400 in FIG. 14. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 1400 (Java is a trademark of Sun Microsystems, Inc. in the United States, other countries, or both).

As a server, data processing system 1400 may be, for example, an IBM eServer™ System p® computer system, running the Advanced Interactive Executive (AIX®) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 1400 may be a symmetric multiprocessor (SMP) system including a plurality of processors in processing unit 1406. Alternatively, a single processor system may be employed.

Instructions for the operating system, the object-oriented programming system, and applications or programs are located on storage devices, such as HDD 1426, and may be loaded into main memory 1408 for execution by processing unit 1406. The processes for illustrative embodiments of the present invention may be performed by processing unit 1406 using computer usable program code, which may be located in a memory such as, for example, main memory 1408, ROM 1424, or in one or more peripheral devices 1426 and 1430, for example.

A bus system, such as bus 1438 or bus 1440 as shown in FIG. 14, may be comprised of one or more buses. Of course, the bus system may be implemented using any type of communication fabric, or architecture that provides for a transfer of data between different components or devices attached to the fabric or architecture. A communication unit, such as modem 1422 or network adapter 1412 of FIG. 14, may include one or more devices used to transmit and receive data. A memory may be, for example, main memory 1408, ROM 1424, or a cache such as found in NB/MCH 1402 in FIG. 14.

Those of ordinary skill in the art will appreciate that the hardware in FIGS. 13 and 14 may vary depending on the implementation. Other internal hardware or peripheral devices, such as flash memory, equivalent non-volatile memory, or optical disk drives and the like, may be used in addition to or in place of the hardware depicted in FIGS. 13 and 14. Also, the processes of the illustrative embodiments may be applied to a multiprocessor data processing system, other than the SMP system mentioned previously, without departing from the spirit and scope of the present invention.

Moreover, the data processing system 1400 may take the form of any of a number of different data processing systems including client computing devices, server computing devices, a tablet computer, laptop computer, telephone or other communication device, a personal digital assistant (PDA), or the like. In some illustrative examples, data processing system 1400 may be a portable computing device which is configured with flash memory to provide non-volatile memory for storing operating system files and/or user-generated data, for example. Essentially, data processing system 1400 may be any known or later developed data processing system without architectural limitation.

Thus, the illustrative embodiments provide mechanisms for increasing the scalability of transformation-based formal verification solutions through enabling the use of phase abstraction on logic models that include memory arrays. The mechanism manipulates the array to create a plurality of copies of its read and write ports, representing the different modulo time frames. The mechanism converts all write-before-read arrays to read-before-write and adds a bypass path around the array from write ports to read ports to capture any necessary concurrent read and write forwarding. The mechanism uses an additional set of bypass paths to ensure that the proper write data that becomes effectively concurrent through the unfolding inherent in phase abstraction is forwarded to the proper read port. Where a read fails to match a recent write that becomes concurrent due to unfolding, the mechanism fetches contents directly through the dedicated unfolded read port on the array. If a given read port is disabled or fetches out-of-bounds data, the mechanism applies randomized data to the read port data output.

The mechanism of the illustrative embodiments advances the capacity of formal verification tools. The illustrative embodiments enable the use of phase abstraction within logic simulators and accelerators (emulators). It is widely-known that phase abstraction designs—i.e. eliminating the oscillating clocks—enables dramatic speed increases to simulators. Logic synthesis and front-end design optimization aids often rely upon formal reasoning under the covers to discover optimization opportunities and validate through equivalence checking that the optimization is indeed valid. The given invention dramatically increases the scalability of such applications to large design components that include memory arrays, enabling larger-block syntheses, which enables the automated discovery of greater optimization potential than applications at smaller components—e.g., which black-box out large arrays that cannot be bit-blasted.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing anchor executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for performing phase abstraction on an integrated circuit design with a memory array, the method comprising:
    receiving, by the data processing system, a netlist for an integrated circuit design, wherein the netlist comprises a memory array;
    for a given memory array in the netlist, duplicating each write port of the given memory array for a plurality of time values up to an unfold degree to form a plurality of write ports and unfolding each enable pin, address pin, and data pin in each write port within the plurality of write ports;
    for the given memory array in the netlist, duplicating each read port of the given memory array for the plurality of time values to form a plurality of read ports and unfolding each enable pin, address pin, and data pin in each read port within the plurality of read ports;
    for each data pin of the plurality of read ports, creating a multiplexor structure to form a phase abstracted integrated circuit design, wherein the multiplexor structure selects an output of the data pin based on whether an address of the read port is out-of-bounds, whether the read port is enabled, and whether the memory array is a write-before-read array; and
    outputting, by the data processing system, the phase abstracted integrated circuit design.

2. The method of claim 1, further comprising:
    responsive to the memory array being a write-before-read array, converting the memory array to a read-before-write array.

3. The method of claim 2, further comprising:
    adding a bypass path around the array from write ports to read ports to capture concurrent read and write forwarding.

4. The method of claim 1, further comprising:
    adding a set of bypass paths to ensure that proper write data the becomes effective concurrent through unfolding is forwarded to a proper read port.

5. The method of claim 1, wherein the multiplexor structure selects a corresponding data pin of the read port if the address of the read port is out-of-bounds or the read port is disabled; and
    wherein the multiplexor structure selects a corresponding highest priority write data pin if the memory array is a write-before-read array and any write port for a given time value is enabled for an address that matches the address of the read port.

6. The method of claim 1, further comprising:
    performing verification on the phase abstracted integrated circuit design to form a phase abstracted trace; and
    undoing effects of phase abstraction in the trace to form a new trace.

7. The method of claim 6, wherein undoing the effects of phase abstraction comprises:
    for each trace time value in the phase abstracted trace, applying time zero values from the phase abstracted trace to the new trace; and
    for each trace time value in the phase abstracted trace, for each phase abstracted time value and for each write port from lower to higher precedence, inject value to the new trace for an actual time value if the write port is enabled for the given time value.

8. The method of claim 7, wherein the actual time value is the trace time value multiplied by the unfold degree plus the abstracted time value plus one if the memory array is a write-before-read array and wherein the actual time value is the trace time value multiplied by the unfold degree plus the phase abstracted time value if the memory array is a read-before-write array.

9. A computer program product comprising a non-transitory computer readable storage medium having a computer readable program stored therein, wherein the computer readable program, when executed on a computing device, causes the computing device to:
    receive, by the computing device, a netlist for an integrated circuit design, wherein the netlist comprises a memory array;
    for a given memory array in the netlist, duplicate each write port of the given memory array for a plurality of time values up to an unfold degree to form a plurality of write ports and unfold each enable pin, address pin, and data pin in each write port within the plurality of write ports;
    for the given memory array in the netlist, duplicate each read port of the given memory array for the plurality of time values to form a plurality of read ports and unfold each enable pin, address pin, and data pin in each read port within the plurality of read ports;
    for each data pin of the plurality of read ports, create a multiplexor structure to form a phase abstracted integrated circuit design, wherein the multiplexor structure selects an output of the data pin based on whether an address of the read port is out-of-bounds, whether the read port is enabled, and whether the memory array is a write-before-read array; and
    output, by the computing device, the phase abstracted integrated circuit design.

10. The computer program product of claim 9, wherein the computer readable program further causes the computing device to:
    responsive to the memory array being a write-before-read array, converting the memory array to a read-before-write array.

11. The computer program product of claim 10, wherein the computer readable program further causes the computing device to:
    adding a bypass path around the array from write ports to read ports to capture concurrent read and write forwarding.

12. The computer program product of claim 9, wherein the computer readable program further causes the computing device to:
   adding a set of bypass paths to ensure that proper write data the becomes effective concurrent through unfolding is forwarded to a proper read port.

13. The computer program product of claim 9, wherein the multiplexor structure selects a corresponding data pin of the read port if the address of the read port is out-of-bounds or the read port is disabled; and
   wherein the multiplexor structure selects a corresponding highest priority write data pin if the memory array is a write-before-read array and any write port for a given time value is enabled for an address that matches the address of the read port.

14. The computer program product of claim 9, wherein the computer readable program further causes the computing device to:
   performing verification on the phase abstracted integrated circuit design to form a phase abstracted trace; and
   undoing effects of phase abstraction in the trace to form a new trace.

15. The computer program product of claim 9, wherein the computer readable program is stored in a computer readable storage medium in a data processing system and wherein the computer readable program was downloaded over a network from a remote data processing system.

16. The computer program product of claim 9, wherein the computer readable program is stored in a computer readable storage medium in a server data processing system and wherein the computer readable program is downloaded over a network to a remote data processing system for use in a computer readable storage medium with the remote system.

17. An apparatus, comprising:
   a processor; and
   a memory coupled to the processor, wherein the memory comprises instructions which, when executed by the processor, cause the processor to:
      receive a netlist for an integrated circuit design, wherein the netlist comprises a memory array;
      for a given memory array in the netlist, duplicate each write port of the given memory array for a plurality of time values up to an unfold degree to form a plurality of write ports and unfold each enable pin, address pin, and data pin in each write port within the plurality of write ports;
      for the given memory array in the netlist, duplicate each read port of the given memory array for the plurality of time values to form a plurality of read ports-and unfold each enable pin, address pin, and data pin in each read port within the plurality of read ports;
      for each data pin of the plurality of read ports, create a multiplexor structure to form a phase abstracted integrated circuit design, wherein the multiplexor structure selects an output of the data pin based on whether an address of the read port is out-of-bounds, whether the read, port is enabled, and whether the memory array is a write-before-read array; and
      output the phase abstracted integrated circuit design.

18. The apparatus of claim 17, wherein the instructions further cause the processor to:
   responsive to the memory array being a write-before-read array, converting the memory array to a read-before-write array.

19. The apparatus of claim 18, wherein the instructions further cause the processor to:
   adding a bypass path around the array from write ports to read ports to capture concurrent read and write forwarding.

20. The apparatus of claim 17, wherein the instructions further cause the processor to:
   adding a set of bypass paths to ensure that proper write data the becomes effective concurrent through unfolding is forwarded to a proper read port.

* * * * *

UNITED STATES PATENT AND TRADEMARK OFFICE
CERTIFICATE OF CORRECTION

PATENT NO. : 8,566,764 B2  
APPLICATION NO. : 12/771404  
DATED : October 22, 2013  
INVENTOR(S) : Baumgartner et al.

Page 1 of 1

It is certified that error appears in the above-identified patent and that said Letters Patent is hereby corrected as shown below:

On the Title Page

Col. 1, lines 16-17, Item (*) Notice, please delete: "This patent is subject to a terminal disclaimer.".

Signed and Sealed this

Second Day of December, 2014

Michelle K. Lee
*Deputy Director of the United States Patent and Trademark Office*